United States Patent
Verkuil et al.

[11] Patent Number: 6,091,257
[45] Date of Patent: Jul. 18, 2000

[54] VACUUM ACTIVATED BACKSIDE CONTACT

[76] Inventors: Roger L. Verkuil, 37 Sherwood Hts., Wappinger Falls, N.Y. 12590; Meindert J. Kleefstra, 34303 Bramble La., Solon, Ohio 44139

[21] Appl. No.: 09/032,496

[22] Filed: Feb. 26, 1998

[51] Int. Cl.[7] .................................................. G01R 31/26
[52] U.S. Cl. .............................................................. 324/765
[58] Field of Search ................................... 324/754, 755, 324/758, 760, 765, 757

[56] References Cited

U.S. PATENT DOCUMENTS

| | | | |
|---|---|---|---|
| 4,538,104 | 8/1985 | Douglas et al. | 324/754 |
| 4,583,042 | 4/1986 | Riemer | 324/519 |
| 4,870,354 | 9/1989 | Davaut | 324/757 |
| 5,027,063 | 6/1991 | Letourneau | 324/754 |
| 5,070,297 | 12/1991 | Kwon et al. | 324/754 |
| 5,703,493 | 12/1997 | Weeks et al. | 324/755 |

*Primary Examiner*—Josie Ballato
*Assistant Examiner*—T. R. Sundaram
*Attorney, Agent, or Firm*—Pearne, Gordon, McCoy & Granger LLP

[57] ABSTRACT

An apparatus for making and verifying electrical contact with the backside of a semiconductor wafer having a bulk portion covered with an insulating layer of oxide includes a contact probe, a wafer chuck having at least one probe vacuum groove and a probe aperture and a probe cylinder having a low pressure and a high pressure portion. The low pressure portion communicates with the probe vacuum groove and the probe aperture. The apparatus further includes a piston movably located between the low pressure and high pressure portions. The contact probe is attached to the piston and adapted to be protrudable from the probe aperture. The groove, aperture and low pressure portion are adapted to form a low pressure chamber with the wafer. The probe is urgeable to pierce the oxide and make electrical contact with the bulk portion of the wafer. The apparatus further includes a time-varying voltage source connectable between the chuck and the probe, and a current measuring device for measuring a current between the chuck and the probe. The probe is in electrical contact with the wafer if the current corresponds at least to a capacitive coupling between the chuck and the wafer.

3 Claims, 1 Drawing Sheet

5,091,257

VACUUM ACTIVATED BACKSIDE CONTACT

BACKGROUND OF THE INVENTION

The present invention relates to the testing of a semiconductor wafer and, more particularly, to providing an electrical connection to the backside of the wafer.

During the testing of semiconductor wafers it is often desirable to force the semiconductor bulk (e.g., silicon) to a particular potential. This is typically accomplished by using a sharp electrical contact to scratch through the oxide layer on some portion of the wafer.

This scratching process does not lend itself well to the automated testing of wafers, particularly in the case of thick oxides which may be, for example, as much as a micron in thickness. Even using contacts of tungsten carbide, the point of the contact is quickly dulled or even broken.

The problem is further complicated by the difficulty of determining if an ohmic connection has been made where the tests being performed are otherwise contactless. In this case, direct measurement of the quality of the connection would require an additional contact to be made to allow a resistance value to be measured between the contacts.

SUMMARY OF THE INVENTION

An apparatus for making electrical contact with the backside of a semiconductor wafer includes a contact probe; a wafer chuck having at least one probe vacuum groove and a probe aperture; a probe cylinder having a low pressure and a high pressure portion, the low pressure portion communicating with the probe vacuum groove and the probe aperture; and a piston movably located between the low pressure and high pressure portions. The contact probe is attached to the piston and adapted to be protrudable from the probe aperture. The groove, aperture and low pressure portion are adapted to form a low pressure chamber with the wafer whereby the probe is urgeable into contact with the backside of the wafer.

DESCRIPTION OF THE PREFERRED EMBODIMENTS

Figures 1, 2:
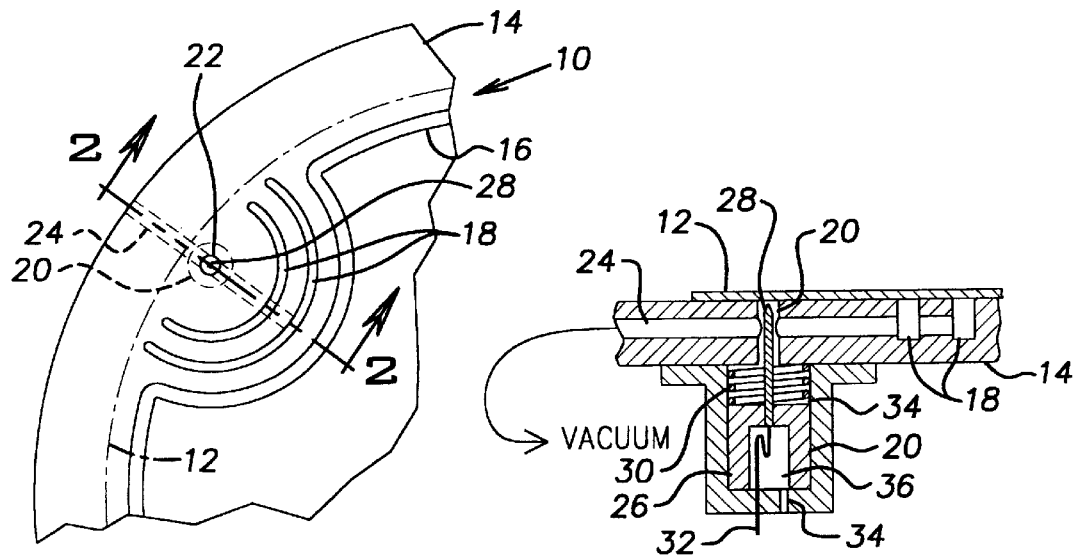
FIG. 1 is a fragmentary top plan view of an apparatus according to the invention.
FIG. 2 is an enlarged fragmentary cross sectional view of the apparatus of FIG. 1 along the line 2—2.

Referring to FIGS. 1 and 2, an apparatus 10 for making electrical contact with the backside of a wafer 12 includes a vacuum wafer chuck 14. In FIG. 1, the wafer 12 is shown in phantom.

The chuck 14 includes a perimeter vacuum groove 16 generally about the perimeter of the chuck 14 which is used to hold the wafer 12 to the chuck during testing. Vacuum applied to the groove 16 primarily keeps the wafer 12 centered on the chuck 14. At least the upper surface of the chuck 14 is electrically conductive.

One or more probe vacuum grooves 18 are arranged on the surface of the chuck 14 within the perimeter of the wafer 12 about a probe cylinder 20. The probe cylinder 20 is located below the upper surface of the chuck 14. A probe aperture 22 provides an opening between the upper surface of the chuck 14 and the probe cylinder 20. The probe cylinder 20 may be, for example, formed integrally with the chuck 14 or, as in the preferred embodiment, separately attached to the underside of the chuck 14 by, for example, unshown fasteners such as machine screws.

A vacuum manifold 24 intersects the probe aperture 22 and the probe vacuum grooves 18. A piston 26 is mounted within the cylinder 20. A contact probe 28 is mounted on the piston 26 such that the tip of the probe 28 will protrude from the probe aperture 22 when the piston 26 is moved toward the top of the cylinder 20. A helical spring 30 is located in the cylinder 20 above the piston 26.

The probe 28 may be, for example, a tungsten carbide needle. The pointed tip of the tungsten carbide needle may be advantageously roughened with an abrasive wheel. This provides a superior contact probe compared to a smooth, radiused point. The probe 28 is connected to a wire 32 which provides an external connection to the probe 28. An aperture 34 is provided in the cylinder 20 to provide a vent to ambient pressure. The probe 28 is electrically insulated from the chuck 14. In the preferred embodiment, the probe 28 does not contact the walls of the probe aperture 22. The piston 26 may be, for example, formed from, or encased in, an electrically insulating material. In the preferred embodiment, the interior of the cylinder 20 may be, for example, lined with glass and the piston 26 formed of graphite.

A low pressure portion 34 of the cylinder 20 is above the piston 26 and a high pressure portion 36 of the cylinder 20 is below the piston 26.

In operation, the probe 28 is moved into contact with the wafer 12 when a sufficient pressure differential is applied between the manifold 24 and the aperture 34. In the preferred embodiment, this takes place when an unshown vacuum source is applied to the manifold 24 via an unshown conduit. The manifold 24, the probe vacuum grooves 18, the aperture 22 and the low pressure portion 34 of the cylinder 20 form a low pressure chamber with the wafer 12. Ambient pressure through the aperture 34 forces the piston 26 toward the wafer 12, overcoming the force of the helical spring 30.

As the piston 26 moves toward the wafer 12, the probe 28 is urged into contact with the backside of the wafer 12. At the same time, the probe vacuum grooves 18 provide additional (compared to the perimeter vacuum groove 16) suction to the wafer 12 to prevent the probe 28 from dislodging the wafer 14 and breaking the vacuum between the wafer 12 and the chuck 14. The surface area and number of the grooves 18 and the piston 26 can be matched to provide a desired maximum force on the probe 28 for a given pressure differential.

Figure 3:
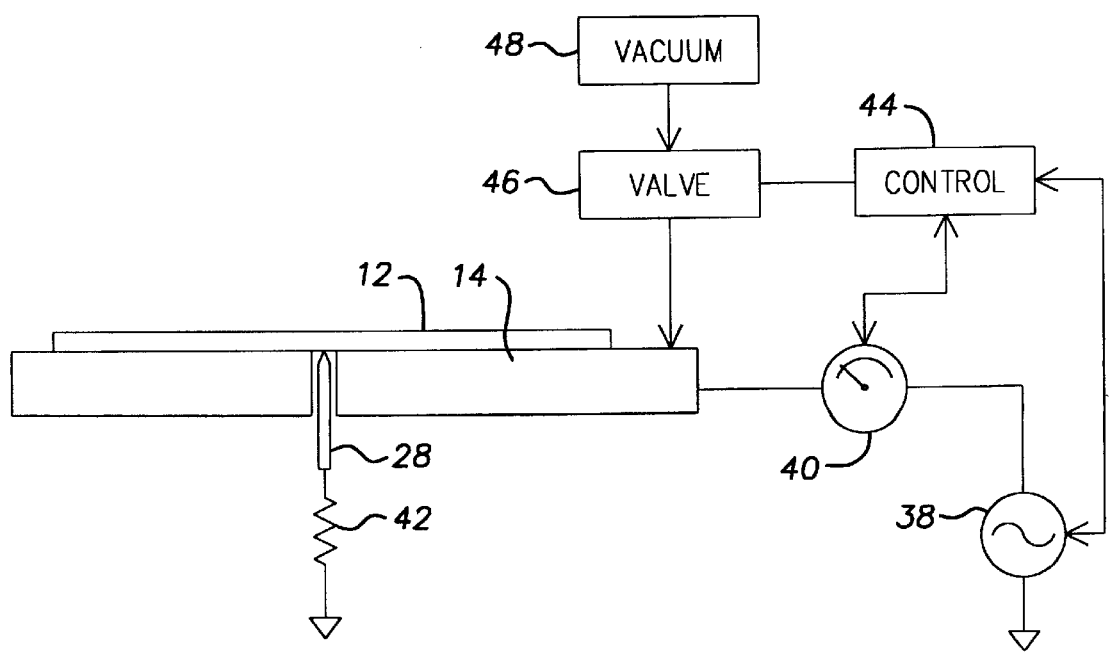
FIG. 3 is a schematic diagram of an apparatus according to the invention.

While the probe 28 may be in physical contact with the backside of the wafer 12, it will not necessarily be in electrical contact with the semiconductor bulk of the wafer 12. Referring to FIG. 3, a circuit for determining if the probe 18 is in electrical contact with the wafer 12 includes a time-varying voltage source 38 connected through a current measuring device 40 connected to the chuck 14. The contact probe 28 is connected through a load resistor 42 back to the voltage source 38. The resistor 42 may be, for example, 10 kilohms.

The voltage source may provide, for example, a sinusoidal AC voltage. The voltage may have, for example, a frequency of one kilohertz and a peak-to-peak amplitude of 20 millivolts. If desired other time-varying voltages, such as pulses, could be used.

The time-varying voltage is capacitively coupled into the wafer 12 by the chuck 14 (in some cases, there may actually be an ohmic connection between the wafer 12 and the chuck 14, particularly in the case of a very thin oxide layer on the wafer, 12, but this is considered to be the exception because then a contact probe would not be needed).

If the contact probe 28 is not in electrical contact with the wafer 12, the only return path for current is through the capacitance between the probe 28 and the wafer 12 which for this analysis may be considered negligible. If the probe 28 is in ohmic contact with wafer 12, current flows across the wafer/chuck capacitance, into the probe 28 and through the resistor 42 back to the source 38.

In practice, the impedance of the wafer/chuck capacitance may be, for example, on the order of 1 kilohm and the ohmic contact between the probe 28 and the wafer 12 less than 1 kilohm. As a result, if the probe 28 is in ohmic contact with the wafer 12, the current measured by the device 40 will correspond basically to the source 38 divided by the resistor 42. Otherwise, the current will be effectively zero. If the current corresponds at least to a capacitive coupling between the chuck 14 and the wafer 12, a probe connection exists. Otherwise, the probe/wafer capacitance dominates and the current is essentially zero.

In the preferred embodiment, the voltage source 38 and current measuring device 40 may be embodied in the form of a source measure unit, which can provide the desired functions under the control of a controller 44. The controller 44 may be, for example, a general purpose computer.

A vacuum pressure regulator 46 placed between the vacuum source 48 and the chuck 14 allows the force on the contact probe 28 to be varied under the control of the controller 44.

The contact probe 28 can be pushed against the wafer 12 with an initially low force. The electrical contact is checked by the controller 44 and if no contact is made, the pressure can be incrementally increased until electrical contact is achieved. This minimizes the chance of physical damage to the wafer 12 from the contact probe 28.

As the force on the contact probe 28 increases, the invention also serves as fail safe protection against the wafer 12 being pushed up from the chuck 14 and into delicate test instruments located closely above the wafer. As soon as the wafer 12 starts to lift, the piston 26 loses vacuum and stops rising, thus automatically protecting against the wafer 12 being dislodged and causing possible damage to the test equipment or the wafer itself.

While the preferred embodiment has vacuum supplied separately to the perimeter vacuum groove 16 and the probe vacuum grooves 18, it is also possible to provide the groove 16 with vacuum from the manifold 24.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An apparatus for making and verifying electrical contact with the backside of a semiconductor wafer having a bulk portion covered with an insulating layer of oxide, said apparatus comprising:

a contact probe;

a wafer chuck having at least one probe vacuum groove and a probe aperture;

a probe cylinder having a low pressure and a high pressure portion, said low pressure portion communicating with said probe vacuum groove and said probe aperture;

a piston movably located between said low pressure and high pressure portions, said contact probe being attached to said piston and adapted to be protrudable from said probe aperture, wherein said groove, aperture and low pressure portion are adapted to form a low pressure chamber with said wafer whereby said probe is urgeable to pierce said oxide and make electrical contact with the bulk portion of said wafer;

a time-varying voltage source connectable between said chuck and said probe; and a current measuring device for measuring a current between said chuck and said probe, said probe being in electrical contact with said wafer if said current corresponds at least to a capacitive coupling between said chuck and said wafer.

2. An apparatus according to claim 1, further comprising a pressure regulator, said regulator being controllable to provide a progressively greater force on said contact probe until said electrical contact is established between said bulk portion and said contact probe.

3. A method for making and verifying electrical contact with the backside of a semiconductor wafer having a bulk portion covered with an insulating layer of oxide, said method comprising:

providing a contact probe;

providing a wafer chuck having at least one probe vacuum groove and a probe aperture;

providing a probe cylinder having a low pressure and a high pressure portion, said low pressure portion communicating with said probe vacuum groove and said probe aperture;

providing a piston movably located between said low pressure and high pressure portions, said contact probe being attached to said piston and adapted to be protrudable from said probe aperture, wherein said groove, aperture and low pressure portion are adapted to form a low pressure chamber with said wafer whereby said probe is urgeable to pierce said oxide and make electrical contact with the bulk portion of said wafer;

applying a pressure differential to said low pressure chamber to urge said probe into contact with said wafer, said pressure differential being variable to provide a variable force on said contact probe;

applying a varying voltage between said chuck and said probe; and measuring a current resulting from said varying voltage, said probe being in electrical contact with said bulk portion if said current corresponds at least to a capacitive coupling between said chuck and said wafer, said variable force being progressively increased until said electrical contact is established.

* * * * *